United States Patent [19]
Wolfe et al.

[11] Patent Number: 6,159,558
[45] Date of Patent: Dec. 12, 2000

[54] PROCESS FOR PRODUCING A CARBON FILM ON A SUBSTRATE

[75] Inventors: John Charles Wolfe; James Richard Wasson, both of Houston, Tex.

[73] Assignee: The University of Houston, Houston, Tex.

[21] Appl. No.: 09/415,995

[22] Filed: Oct. 12, 1999

[51] Int. Cl.[7] .................................................. C23C 14/00
[52] U.S. Cl. ...................... 427/523; 204/192.1; 427/294; 427/553; 427/595
[58] Field of Search .................................. 427/553, 595, 427/294, 523; 204/192.1

Primary Examiner—Bernard Pianalto

[57] ABSTRACT

A method for producing a carbon film on a substrate, comprising the steps of (a) depositing a carbon layer of a predetermined thickness onto the substrate, e.g. using off-axis sputtering, the carbon layer having predominantly graphitic or amorphous structure, and (b) treating the carbon layer by means of an radio-frequency discharge in a helium atmosphere wherein the substrate is held at a negative dc bias voltage of a preselected value, where the thickness of the carbon layer deposited in step a) is chosen not greater than the longitudinal stop range of the helium ions corresponding to the bias voltage used in step b). After producing a first carbon layer of a predetermined thickness, a next carbon layer is likewise produced upon the first carbon layer and the procedure can be repeated until the total thickness of the layers attains a desired final thickness.

11 Claims, 3 Drawing Sheets

PROCESS FOR PRODUCING A CARBON FILM ON A SUBSTRATE

The invention refers to producing a carbon film on a substrate.

Carbon films are used in many technical fields for a variety of purposes, e.g. as a protecting coating against high-energy radiation, as a conductive covering or in order to obtain a high emissivity for radiation cooling. The purpose which is mainly discussed here is that as a radiation-absorbing layer for stencil masks in X-ray or ion-beam lithography, where a mask contains a silicon membrane with structures, formed e.g. as holes in the mask. These structures are projected by means of an ion beam irradiating on the mask onto, for instance, a wafer.

A bare silicon membrane, which can be patterned and used as a lithography stencil mask, can only withstand a total charge density of 200 $\mu C/cm^2$ before its intrinsic stress changes drastically. To meet the needs of future lithography in VLSI and ULSI circuits, a mask will have to be capable of withstanding up to ten million exposures. This is approximately the number of exposures that can take place between design generations. The ion dose required to fully expose photoresist is approximately $5 \times 10^{12}$ ions/cm$^2$. Therefore a stencil mask used in a proximity printer would be bombarded with $5 \times 10^{19}$ ions/cm$^2$ or 8 C/cm$^2$ after ten million exposures. The ion beam could also be de-magnified as with an ion projection lithography system. With a demagnification of 4× the stencil mask would be bombarded with $3.125 \times 10^{18}$ ions/cm$^2$, which equates to a total charge density of 500 mC/cm$^2$ at the stencil mask.

It has been shown previously that silicon membranes swell during lithium ion bombardment due to ion implantation into the silicon crystal interstitial positions. Hydrogen or helium ions bombarding a silicon membrane also cause swelling which, in this case, is the main cause for swelling. Hydrogen diffuses out of the silicon membrane when the temperature is set to 450° C. for approximately 30 minutes, while helium diffuses out of the silicon membrane at a temperature of 700° C. for approximately 8 hours, After the thermal treatment, the silicon membrane returns to its original tension for small doses; for higher doses, the membrane is permanently damaged.

With masks of a material different from silicon, the problem stays in principle unchanged, although the extent of stress change due to irradiation can vary. It is obvious that this phenomenon is not limited to the irradiation with ions but also occurs with electrically neutral atoms or molecules. Moreover, since the lattice is affected by not only the implantation of atoms or molecules, but also by the impact of the energetic radiation itself, stress change effects will prevail also for irradiation with electrons or high-energy electromagnetic radiation, as e.g. X-rays. Where, therefore, the following discussion refers to ion projection lithography, the considerations also apply, with only minor adaptations, as e.g. taking the respective equivalent doses of irradiation, for the more general case of X-ray and corpuscular projection lithography.

In order to increase the life of a silicon stencil mask, it is necessary to prevent the mask from swelling. The mask distortion tolerances which are allowable from industrial standards are defined over the value of initial stress and the long-term stability of the mask absorber stress, and other quantities which are not of interest with respect to the invention. For instance, the following limits for a 0.5 $\mu$m thick ion-absorbing layer on a 3.0 $\mu$m thick silicon layer should be met:

1. The accuracy of initial stress after production should be within ±7 MPa, and
2. The stress stability should be within ±7 MPa when the mask is irradiated for a total ion dose of up to about 1 C/cm$^2$.

Both limits are understood as the 3σ-width of the distribution of stresses measured over the surface of the silicon foil. Carbon is a candidate film for this application, since carbon has the additional advantages of a high emissivity of between 0.7 and 0.8 and, provided a suitable production method is available for carbon films, compatibility with the mask fabrication sequence since carbon can be easily patterned in oxygen.

A method which is often used for the production of carbon films is the sputter technique. According to this technique, a vacuum gas discharge is maintained, in which particles are detached from the cathode by the impact of ions of the discharge and are deposited on a substrate placed in the vicinity of the cathode, thus forming a layer on the substrate whose properties may be determined not only by the material of the cathode but also by the conditions of gas composition, gas pressure etc.

A well-known problem of sputter deposition of carbon in, for instance, argon atmosphere is the fact that the layers thus produced show a very high compressive stress which can attain values of more than 100 MPa and up to the range of several GPa, as described e.g. by E. Broitman et al., Applied Physics Letters, Vol. 72, No. 20 (1998), S. 2532. The compressive stress causes the surfaces on which these carbon films have been deposited in most cases to display wrinkles and waves, thus it renders the layer unusable, as well as results in insufficient adhesion to the substrate and/or the impairment, possibly destruction, of the substrate surface or the entire substrate.

The post-published GB 9810 993.7 (=U.S. Ser. No. 08/862,770) of the applicant describes an off-axis sputtering method for producing a carbon layer in combination with a step for modifying the properties of the carbon layer using ion irradiation. The off-axis sputtering step serves as a grounds for the invention and is discussed further below. The helium ion irradiation step proposed in the GB 9810 993.7 anticipates changes in the film due to initial irradiation and serves to reach a plateau in which the stress varies only little, i.e. within an interval of about 1 MPa or less. Thus the vitreous carbon films, formed by a two-step process involving the use of He$^+$ ion implantation to vitrify a low-stress sputtered graphite film, satisfy the above-stated stress stability requirements. The ion energies are chosen conveniently such that the projected range of the helium ions corresponds to the thickness of the carbon coating, but is still less, in order to avoid implantation to the membrane beneath the carbon film. The films thus produced have a compressive stress of the order of 10 MPa or below. However, high cost, lack of initial stress predictability, and the presence of a thin graphitic layer between the vitrified carbon and the silicon membrane layer make this process unsuitable for mask blank fabrication. Moreover, the irradiation step needs to be performed in an ion irradiation system, and therefore the production of these carbon films is inconvenient, especially if an inspection of the substrate is desired after or during the process.

It is the aim of the invention to provide a method for the production of carbon layers of both low inner stress and high stress stability, where the method is not only compatible with the fabrication sequence of e.g. a mask foil fabrication procedure but also allows the carbon film to be produced in-situ, i.e. within one reaction chamber. In particular the need to use a helium high-energy irradiation step shall be overcome.

This aim is achieved by a method for producing a carbon film on a substrate, comprising the steps of a) depositing a carbon layer of a predetermined thickness onto the substrate, the carbon layer having predominantly graphitic or amorphous structure, and b) treating the carbon layer by means of an radio-frequency discharge in a helium atmosphere wherein the substrate is held at a negative dc bias voltage of a preselected value.

By this method carbon films of low initial stress can be produced, with a high stress stability even for high doses of irradiation. Moreover, this is a production method which can be carried out in conventional process equipment and it is compatible with integration into the wafer flow mask fabrication process which has been adopted for, e.g., ion beam lithography.

If it is required to produce a film of a thickness greater than the thickness of the layer which can be produced in a single deposition and helium treatment sequence for the given requirements on, e.g., the film stress, the production of a carbon layer according to the invention is repeated. By each repetition, a new layer is produced so as to increase the total thickness of the carbon film formed by the set of layers. Thus, after producing a first carbon layer of a predetermined thickness according to the method as stated above, a next carbon layer is likewise produced upon the first carbon layer and the procedure is repeated until the total thickness of the layers attains a desired final thickness.

Advantageously the thickness of the carbon layer deposited in step a) is chosen not greater than the longitudinal stop range of the helium ions corresponding to the bias voltage used in step b). This ensures that the entire deposited layer is affected by the treatment with helium ions.

It is further useful if the deposition method used in step a) provides a low-stress graphitic carbon film. One preferred deposition method is off-axis sputtering from at least one carbon target.

Advantageously the bias voltage used during the layer treatment in step b) is in the range of 100 to 5000 V, where the upper limit can be reduced to 2000 V. Best results for the carbon films produced were obtained for a bias voltage in the range of 300 to 700 V.

It is further advantageous if during the layer treatment, the helium atmosphere has a pressure in the range of 0.5 to 10 mTorr. Best results were obtained for a pressure in the range of 2 to 8 mTorr.

In order to ensure proper vitrification of the carbon layer during the layer treatment, the duration of the layer treatment may be chosen such that the helium ions are deposited into the film by a preselected value of ion charge density, e.g. 0.2 C/cm$^2$.

In a further preferred variant of the invention the substrate is a membrane, e.g. a silicon membrane, used in X-ray or corpuscular lithography.

BRIEF DESCRIPTION OF THE DRAWINGS

The invention is discussed below in detail referring to a preferred embodiment of the invention as displayed in the figures. The figures show.

The embodiment discussed below refers to the production of a silicon membrane which is employed as a stencil mask for ion-projection lithography and which, in order to prevent the implantation of ions into said membrane during ion-projection lithography, is coated with a carbon film. This carbon film coats those surfaces of the silicon membrane which are exposed to ions during ion-projection lithography and thus avoids swelling of the silicon membrane.

The first step of the carbon film production process according to the invention uses off-axis sputtering which is described in the above-mentioned GB 9810 993.7 of the applicant; in the following a description of the off-axis sputtering method are included here as far as concerns the invention.

The carbon film for the above-mentioned usage has the following properties:

a) the structure of said carbon film is graphite-like or amorphous;

b) said carbon film is porous;

c) the stress of the carbon film is low, i.e., below 10 MPa.

These properties allow for a depletion of the implanted hydrogen or helium gasses already at moderate temperatures and increase the life time of the carbon-coated stencil mask.

The emissivity of the coating film has to be large for proper cooling of the silicon membrane. Although the emissivity of a film coating according to this invention will not be the same as the bulk emissivity of carbon, which is 0.7 to 0.8, emissivity values above 0.5 can easily be obtained, and an emissivity of 0.75 is reached for a films approximately one micron thick.

For depositing graphite-like or amorphous carbon films on silicon membranes, a sputtering method is employed in which said silicon membranes are positioned in the off-axis configuration relative to the sputter targets. In this configuration the sputter gun faces away from the substrate and the sputtered particles diffuse onto the substrate. If the off-axis technique is applied to the deposition of carbon, negative carbon ions are similarly generated on the target, however the negative ions generated at the cathode, are prevented from bombarding the substrate.

Figure 1:
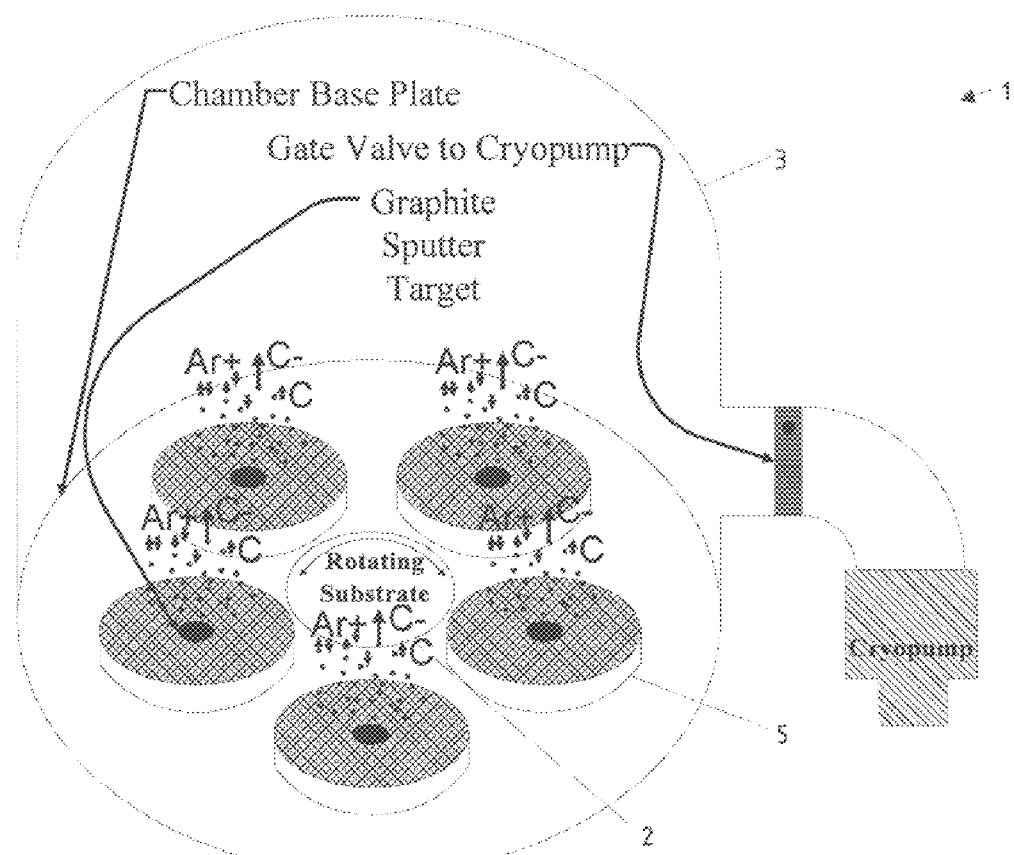
FIG. 1 a simplified view of the sputter chamber used for producing carbon films according to the invention.

In the "off-axis" configuration, the substrate is mounted in such a way within the sputtering chamber that the at least one sputter gun, also mounted in the sputtering chamber and comprising each an anode and a sputter target working as a cathode, faces away from the substrate surface where the film is to be deposited. An example of a sputtering assembly is shown in FIG. 1 and discussed below. The sputtered particles are scattered by gas molecules and reach the substrate after having undergone several scattering collisions, the average number of collisions determined by the geometry and gas pressure of the sputter assembly. This deposition mechanism makes sure that the sputtered particles have low energies of deposition or the substrate. High-energy negative ions generated at the cathode, e.g. negative carbon ions, are prevented from bombarding substrate. In the case of the invention, the sputter material is graphite. The graphite targets need to be heatable and heat-controlled so as to meet the process conditions described below. On the other hand, it is recommended that the temperature of the substrate, which may be a delicate pattern structure, be kept at ambient temperature.

In order to ensure good uniformity and maximum deposition rates, the sputtering pressure used in the above-described method is less than 30 mTorr. The stress of films produced this way is typically less than 5 MPa. In order to obtain carbon layers of graphite-like or amorphous structure, the temperature of the sputter targets is chosen greater than 550° C. Furthermore, a temperature of the sputter targets between 600° C. and 1800° C. prevents the formation of insulating coatings on the target which may lead to arcing and reduce the sputtering rate.

To apply a porous ion-absorbing film with low stress, the sputtering pressure needs to be between 1 mTorr and 30 mTorr. Using the "off-axis" configuration requires a low operating pressure so that sputtered atoms have a sufficiently long mean free path to be scattered onto the substrate. At 30 mTorr, a sputtered atom will typically have made several tens of scattering collisions and would be re-deposited on or near the target. At pressures exceeding 30 mTorr, the mean free path of a sputtered atom is severely reduced.

It was discovered that DC sputtering of a cold graphite target generated severe arcing. This is probably due to the formation of an insulating diamond-like carbon layer on the target due to argon ion bombardment. The diamond-like carbon layer forms an insulator which becomes electrically charged by the electrons travelling in the race track of the target. When this charging effect has produced a voltage higher than the breakdown voltage of the gas inside the chamber, an arc will travel from the target to the nearest grounding point. These arcs generate particulate defects in the film and prevent a stable deposition. Arcing may also extinguish the plasma by consuming the secondary electrons needed to sustain the plasma and, even worse, the arc can eject macroscopic particles from the target, which will severely degrade the performance of the silicon stencil mask. We have found that arcing is completely absent if the target is operated at temperatures above 550° C. We believe that a high target temperature converts the diamond-like coating to graphite. Sputtering on hot targets is described in the patent U.S. Pat. No. 5,415,756 of Chau et al. Coatings have been formed with target temperatures between 600° C. and 2400° C. High temperatures were previously used to evaporate insulating target coatings in DC reactive sputtering, but evaporation is clearly not the mechanism of removal of (insulating) coatings in this case.

Whilst the visual appearance of carbon films deposited by "on-axis" sputtering are shiny and/or glassy, and black or grey in colour, the carbon films deposited by the "off-axis" sputtering are dull and black in colour. The hardness of an "on-axis" film is much greater than the hardness of an "off-axis" film. The increased hardness of an "on-axis" film can be attributed to atomic peening of the substrate by negative carbon ions and reflected sputter gas neutrals.

When a silicon membrane is covered with a protective carbon film, the stress in the membrane is lowered depending on the film thickness. However, when the membrane is exposed to hydrogen (or helium) ions, the stress in the membrane increases to a plateau. The plateau reached is approximately 12 MPa. It was found that the stress in the membrane maintained this plateau value until the proton dose delivered to the membrane was approximately 25 $mC/m^2$, i.e., $1.536 \times 10^{17}$ protons. With this charge density the membrane could be used to perform approximately 500 000 exposures in a 4× lithography system, given that $5 \times 10^{12}$ ions are needed to fully expose photoresist.

For deposition of carbon films of the desired quality, a sputtering assembly 1 as depicted schematically in FIG. 1 can be used. The 58 cm diameter by 47 cm tall stainless-steel chamber 3 is pumped by a cryogenic pump (CTI-10, Cryogenic Inc.). For sputtering operation, the pumping speed is regulated by a throttling valve located between the inlet of the cryopump and the sputtering chamber. The assembly uses five Research S-guns™ 5 (Sputtered Films, Inc.), each containing an anode and a graphite sputter target and capable of 2.4 kilowatts of DC power dissipation. The S-guns 5 are evenly spaced on a ten-inch diameter circle on the base plate of the chamber 3, with the substrate 2 placed at the centre. The substrate 2 is electrically floating and can be cooled with helium gas through a rotating wafer holder (not shown in the figure). This configuration, in which carbon atoms diffuse from the targets to the substrate, results in very little substrate bombardment by either argon neutrals or negative carbon ions. As a result, the films are graphitic in nature and exhibit extremely low stress.

After deposition of the carbon film a treatment of the deposited film is performed in order to stabilize the stress in the film. As mentioned above, the GB 9810 993.7 describes a method of modifying carbon films by high-energy implantation of helium ions by ion bombardment at ion energies such that the helium ions have a projected range of implantation of the order or just below the thickness of the carbon film. In practice it was found that the minimum dose for stabilization is about 0.12 $C/cm^2$. This method for producing a carbon film will be referenced below as the 'original' method.

To grow the vitreous layers in-situ, i.e. without the need to displace the substrate from the substrate holder in the sputtering chamber shown in FIG. 1, a treatment of the films by $He^+$ ions from a radio-frequency discharge is incorporated. A process of alternate deposition and helium treatment has been adopted to uniformly vitrify the 0.5 $\mu$m thick ion protective films. It should be noted that simple bias sputtering in argon also produces vitrification but the stress of such films was found to be unacceptably high. It is important to recognize that, while off-axis sputtering is a new concept for the deposition of low stress coatings, it can be carried out in traditional sputtering systems. As mentioned above, the sputter-coater shown in FIG. 1 is modeled rather closely on a commercial unit sold by Sputtered Films, Inc.; the only difference is that the helium-cooled substrate holder is mounted in the plane of the guns in the base-plate of the system rather above. These commercial guns are suited, without modification, for hot (>1500° C.) target operation, a mode which enhances the sputtering yield by a factor of 40. The main characteristic that we require of the off-axis films is low stress, which results from very weak bombardment of the growing film by either argon neutrals or negative carbon ions. Uniform coatings are possible over at least 150 mm substrates (6") in the pressure range between 4 and 10 mTorr and the deposition time for a 0.5 $\mu$m thick film is only about 15 minutes, with five guns operating.

In the new, in-situ deposition process for vitreous carbon, the method used is to sequentially deposit thin layers of graphitic carbon about 10–20 nm thick that are vitrified by replacing the argon sputtering gas with helium and applying an RF-bias to the substrate holder. The RF-bias is performed by igniting an RF discharge and simultaneously applying a bias voltage to the substrate holder. In the case of the sputter-coater chamber of FIG. 1, the chamber wall serves as second electrode (ground potential).

Figure 2:
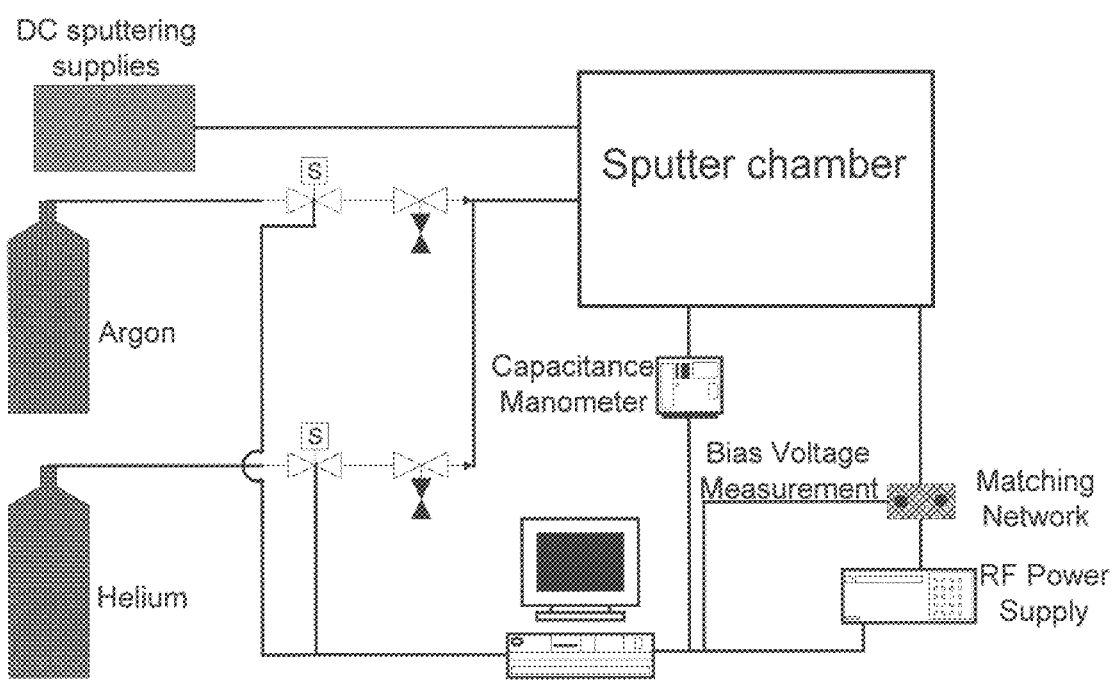
FIG. 2 a schematic representation of the computer-controlled deposition system for controlling the film production in the sputter chamber of FIG. 1.

FIG. 2 is a schematic representation of the computer-controlled deposition system that performs the complicated function of controlling the production steps of the 'in-situ' method according to the invention. The computer introduces argon into the system and activates the DC-power supplies to the sputter sources during deposition. The valves are then actuated to replace the argon atmosphere with helium during the treatment cycle and the RF-bias supply turned on. Typically, the bias voltage is 500 V that is sufficient to vitrify fully a 10 nm thick film (the range of these ions is about 20 nm in carbon). The bias is applied for a sufficient time, about 1 minute, to deposit a minimal $He^+$ charge density of 0.2 $C/cm^2$ into the film. The required dose was determined from the ion implantation studies discussed above. Experiments performed by the applicant indicate that already at a lower charge density, e.g. 0.15 $C/cm^2$ or even only 0.1 $C/cm^2$, may be sufficient for reaching the stability plateau. The deposition and the treatment were repeated until the film thus produced attained the desired final thickness. The total time to deposit a 0.5 $\mu$m thick ion protective layer (about 25 cycles of deposition and treatment) is about 45 minutes, but higher rates should be possible through process optimization.

In general, appropriate values of the bias voltage used during the vitrification treatment is in the range of 100 to 5000 V, where the upper limit can be reduced to 2000 V. Best results for the carbon films produced were obtained for a bias voltage in the range of 300 to 700 V. The bias voltage as well as the thickness of the layer deposited in the previous deposition step should be chosen such that the longitudinal stop range of the helium ions corresponds to the layer thickness. On the other hand, the bias voltage cannot be made too high since for $He^+$ energies too high, the helium ions will stop within the layer but not affect the surface-near regions of the layer, in contrast to the desired effect that the entire carbon layer is vitrified.

Figure 3:
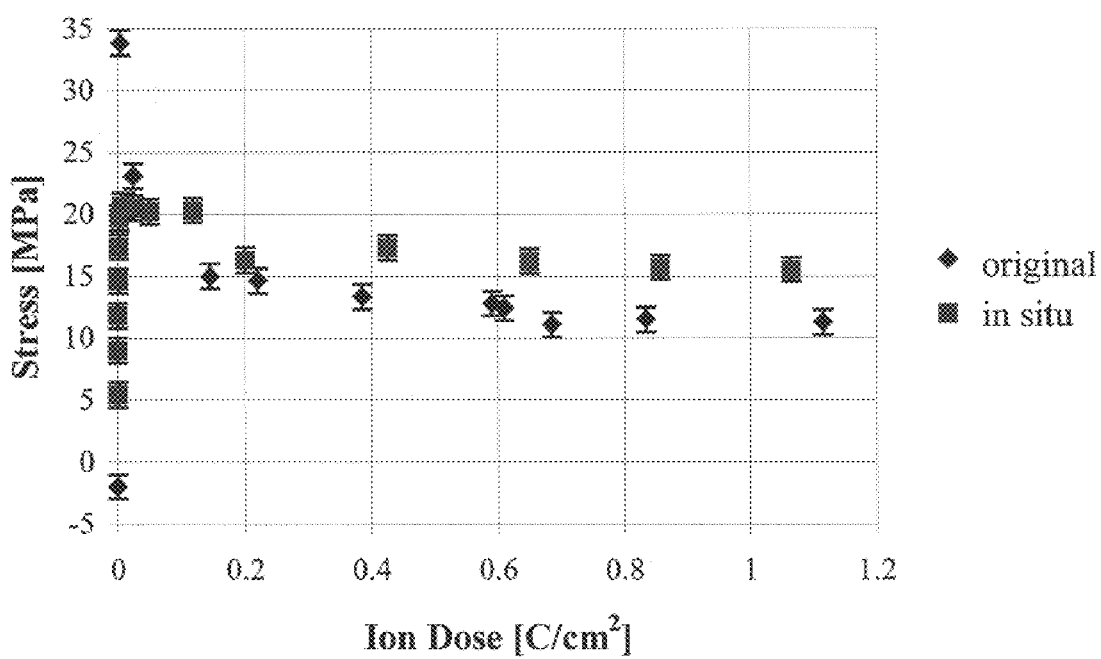
FIG. 3 the dependence of the inner stress as a function of the ion dose upon exposure to 40 keV He$^+$ ions, for a carbon film produced by the method according to the invention (square symbols) in comparison with a carbon film deposited by off-axis sputtering and treated by a high-voltage implant (diamonds).

Test results for a film (squares) produced on silicon membranes by the above-described 'in-situ' method are shown in FIG. 3 along with those for a film (diamonds) that was deposited and vitrified by a high voltage implant according to the 'original' process as described in the GB 9810 993.7. The behavior of the stress as a function of the ion dose is shown in FIG. 3 for the two carbon films and exposed to 40 keV $He^+$ ion in an accelerated life-test system. The in-situ carbon film, discussed in the text, shows much less initial stress variation and a final stress which is stable to within experimental error of 7 MPa.

An unexpected increase in deposition rate resulted in a film with 10 nm thick graphitic sheets between the vitreous layers. The 1.25 $\mu$m thick in-situ carbon film was deposited on a 3 $\mu$m thick silicon membrane with an initial stress of 18 MPa and irradiated with 40 keV $He^+$ ions. These ions penetrate about 550 nm into the carbon film. A stable stress plateau of about 20 MPa (corresponding to about 30 MPa in the carbon film) is reached after a total dose of a 3 $mC/cm^2$. After a dose of 200 $mC/cm^2$, the stress level in the carbon film decreases to about −4 MPa (negative values denote compressive stress) and remained there until the experiment was terminated at 1064 $mC/cm^2$. The stress of the in-situ film clearly undergoes much less change and stabilizes at a much lower dose than the film deposited by the two-step process. It is assumed that the initial stress change in the in-situ film is due to vitrification of the graphitic layers in the film, which can clearly be eliminated through better rate control. In this context the useful fact should be stressed that the final stress of the vitreous carbon layer is stable within ±7 MPa.

It should be noted that the invention is not restricted to the example discussed above; rather, it comprises all possible forms as set forth in the independent claim 1 which will be realized by those skilled in the art. For example, another method suitable for depositing the carbon layer in step a) is the sputtering method as disclosed in the AT 1190/98, in which carbon is deposited on a substrate in a gas mixture containing at least 20% nitrogen and subsequently a thermal treatment of the substrate is performed at a preselected temperature above 100° C., for instance at 180° C., under high vacuum produced by an oil-free vacuum pump. During sputtering, the pressure can be in the range of about 0.2 to 5 Pa and the nitrogen content of the gas mixture is preferably about 50%. In the thermal treatment, preferably the substrat is heated up to the predetermined end temperature of 100° C. (or 180° C.) within a time interval of at least 30 minutes, and then cooled to 70° C. within another time interval of at least 30 minutes; the high vacuum is not broken until the substrate has cooled down correspondingly. Carbon films produced by this method show low compressive stress below 10 MPa or even tensile stress of a few MPa, which is ascribed to a graphitic or graphite-like 'nano-tube' structure of the films.

What is claimed is:

1. A method for producing a carbon film on a substrate, comprising the steps of
    a) depositing a carbon layer of a predetermined thickness onto the substrate, the carbon layer having a predominantly graphitic or amorphous structure, and
    b) treating the carbon layer by means of an radio-frequency discharge in a helium atmosphere wherein the substrate is held at a negative dc bias voltage of a preselected value.

2. The method as claimed in claim 1, wherein the thickness of the carbon layer deposited in step a) is chosen not greater than the longitudinal stop range of the helium ions corresponding to the bias voltage used in step b).

3. The method as claimed in claim 1, wherein the deposition step is performed using off-axis sputtering from at least one carbon target.

4. The method as claimed in claim 1, wherein the bias voltage is in the range of 100 to 5000 V.

5. The method as claimed in claim 1, wherein the bias voltage is in the range of 100 to 2000 V.

6. The method as claimed in claim 1, wherein the bias voltage is in the range of 300 to 700 V.

7. The method as claimed in claim 1, wherein during the layer treatment, the helium atmosphere has a pressure in the range of 0.5 to 10 mTorr.

8. The method as claimed in claim 1, wherein during the layer treatment, the helium atmosphere has a pressure in the range of 2 to 8 mTorr.

9. The method as claimed in claim 1, wherein during the layer treatment helium ions are deposited into the film by a preselected value of ion charge density, e.g. 0.2 $C/cm^2$.

10. The method as claim in claim 1, wherein the substrate is a membrane used in X-ray or corpuscular lithography.

11. A method for producing a carbon film on a substrate, wherein after producing a first carbon layer of a predetermined thickness according to the method as claimed in claim 1, a next carbon layer is likewise produced upon the first carbon layer and the procedure is repeated until the total thickness of the layers attains a desired final thickness.

\* \* \* \* \*

UNITED STATES PATENT AND TRADEMARK OFFICE
CERTIFICATE OF CORRECTION

| | |
|---|---|
| PATENT NO. : 6,159,558 | Page 1 of 1 |
| DATED : December 12, 2000 | |
| INVENTOR(S) : John Charles Wolfe, et al. | |

It is certified that error appears in the above-identified patent and that said Letters Patent is hereby corrected as shown below:

Title page,
Insert -- [30] Foreign Application Priority Data October 12, 1999 [At] Austria .... 1707/98 --.

Signed and Sealed this

Fourth Day of December, 2001

Attest:

*Nicholas P. Godici*

NICHOLAS P. GODICI
*Attesting Officer*     *Acting Director of the United States Patent and Trademark Office*